(12) United States Patent
Jain et al.

(10) Patent No.: US 9,870,442 B2
(45) Date of Patent: Jan. 16, 2018

(54) EQUIVALENCE CHECKING BETWEEN TWO OR MORE CIRCUIT DESIGNS THAT INCLUDE SQUARE ROOT CIRCUITS

(71) Applicant: Synopsys, Inc., Mountain View, CA (US)

(72) Inventors: Himanshu Jain, Hillsboro, OR (US); Carl P. Pixley, Beaverton, OR (US)

(73) Assignee: SYNOPSYS, INC., Mountain View, CA (US)

( * ) Notice: Subject to any disclaimer, the term of this patent is extended or adjusted under 35 U.S.C. 154(b) by 0 days.

(21) Appl. No.: 14/860,549

(22) Filed: Sep. 21, 2015

(65) Prior Publication Data

US 2016/0012177 A1    Jan. 14, 2016

Related U.S. Application Data

(60) Division of application No. 13/665,827, filed on Oct. 31, 2012, now Pat. No. 9,189,581, which is a continuation-in-part of application No. 13/561,895, filed on Jul. 30, 2012, now Pat. No. 8,732,637.

(51) Int. Cl.
| | |
|---|---|
| *G06F 17/50* | (2006.01) |
| *G06F 9/455* | (2006.01) |
| *G06F 7/487* | (2006.01) |
| *G06F 9/30* | (2006.01) |
| *G06F 7/552* | (2006.01) |

(52) U.S. Cl.
CPC ........ *G06F 17/5081* (2013.01); *G06F 17/504* (2013.01); *G06F 7/4873* (2013.01); *G06F 7/4876* (2013.01); *G06F 7/5525* (2013.01); *G06F 9/3001* (2013.01); *G06F 9/455* (2013.01); *G06F 17/50* (2013.01)

(58) Field of Classification Search
CPC .... G06F 17/5081; G06F 17/504; G06F 17/50; G06F 9/455; G06F 7/5525; G06F 7/4873; G06F 7/4876

See application file for complete search history.

(56) References Cited

U.S. PATENT DOCUMENTS

| | | |
|---|---|---|
| 3,284,385 A | 7/1974 | Kiencke |
| 4,402,044 A | 8/1983 | McDonough et al. |
| 4,578,705 A | 3/1986 | Elmis et al. |
| 5,032,913 A | 7/1991 | Hattori et al. |
| 5,091,908 A | 2/1992 | Zorian |

(Continued)

FOREIGN PATENT DOCUMENTS

JP    63190356    8/1988

*Primary Examiner* — Helen Rossoshek
(74) *Attorney, Agent, or Firm* — Park, Vaughan, Fleming & Dowler LLP; Laxman Sahasrabuddhe

(57) ABSTRACT

Methods and apparatuses are described for proving equivalence between two or more circuit designs that include one or more division circuits and/or one or more square-root circuits. Some embodiments analyze the circuit designs to determine an input relationship between the inputs of two division (or square-root) circuits. Next, the embodiments determine an output relationship between the outputs of two division (or square-root) circuits based on the input relationship. The embodiments then prove equivalence between the circuit designs by using the input and output relationships.

14 Claims, 4 Drawing Sheets

---

Analyze the first and second circuit designs to determine an input relationship between the square-root operand of the first square-root circuit and the square-root operand of the second square-root circuit
352

↓

Determine an output relationship between a set of outputs of the first square-root circuit and a set of outputs of the second square-root circuit based on the input relationship
354

↓

Prove equivalence between the first and second circuit designs, wherein said proving involves using the input and output relationships
356

(56) References Cited

U.S. PATENT DOCUMENTS

| | | | |
|---|---|---|---|
| 5,151,874 A * | 9/1992 | Jeong | G06F 7/5525 706/16 |
| 5,278,782 A * | 1/1994 | Nakano | G06F 7/5525 708/500 |
| 5,493,506 A | 2/1996 | Sakashita et al. | |
| 5,644,639 A | 7/1997 | Naciri et al. | |
| 5,805,462 A | 9/1998 | Poirot et al. | |
| 5,946,223 A | 8/1999 | Nakajima | |
| 6,060,936 A | 5/2000 | Raghunath | |
| 6,061,781 A | 5/2000 | Jain et al. | |
| 6,101,621 A | 8/2000 | Kondo | |
| 6,523,053 B1 | 2/2003 | Lee et al. | |
| 6,557,146 B1 | 4/2003 | Bormann et al. | |
| 6,571,368 B1 | 5/2003 | Chen | |
| 6,662,346 B1 | 12/2003 | Yu et al. | |
| 6,748,507 B2 | 6/2004 | Kawasaki et al. | |
| 6,931,611 B2 | 8/2005 | Martin et al. | |
| 7,076,753 B2 | 7/2006 | Cerny et al. | |
| 7,082,586 B2 | 7/2006 | Horeth et al. | |
| 7,159,198 B1 | 1/2007 | Ip et al. | |
| 7,185,041 B1 | 2/2007 | End | |
| 7,389,479 B2 | 6/2008 | Koelbl et al. | |
| 7,571,398 B2 | 8/2009 | Bormann et al. | |
| 7,818,699 B1 | 10/2010 | Stuber et al. | |
| 7,836,414 B2 | 11/2010 | Koelbl et al. | |
| 8,166,430 B2 | 4/2012 | Bormann et al. | |
| 8,261,176 B2 | 9/2012 | Alrod et al. | |
| 8,312,361 B2 | 11/2012 | Kamoshida | |
| 8,402,078 B2 | 3/2013 | Weinberg et al. | |
| 8,415,968 B2 | 4/2013 | Swartzlander et al. | |
| 8,429,589 B2 | 4/2013 | Croysdale et al. | |
| 8,458,479 B2 | 6/2013 | Takashima | |
| 8,527,923 B1 | 9/2013 | Akbarpour et al. | |
| 8,626,816 B2 | 1/2014 | Weinberg et al. | |
| 8,640,065 B2 | 1/2014 | Janssen et al. | |
| 8,713,084 B2 | 4/2014 | Weinberg et al. | |
| 8,718,987 B2 | 5/2014 | Wu | |
| 8,819,094 B2 | 8/2014 | Han et al. | |
| 2002/0178432 A1 | 11/2002 | Kim et al. | |
| 2003/0005013 A1 * | 1/2003 | Steele, Jr. | G06F 5/012 708/495 |
| 2005/0270865 A1 | 12/2005 | Boldt et al. | |
| 2009/0083359 A1 * | 3/2009 | Kim | G06F 7/5525 708/605 |
| 2013/0200921 A1 | 8/2013 | Swartzlander et al. | |
| 2016/0147503 A1 * | 5/2016 | Burgess | G06F 7/535 708/650 |

* cited by examiner

Analyze the first and second circuit designs to determine an input relationship between the square-root operand of the first square-root circuit and the square-root operand of the second square-root circuit
352

Determine an output relationship between a set of outputs of the first square-root circuit and a set of outputs of the second square-root circuit based on the input relationship
354

Prove equivalence between the first and second circuit designs, wherein said proving involves using the input and output relationships
356

FIG. 3B

Create a set of properties to prove correctness of a bit-serial division circuit design, wherein the set of properties are capable of being efficiently proven by using a bit-level solver
402

Perform formal verification of the bit-serial division circuit design by attempting to prove the set of properties
404

FIG. 4

EQUIVALENCE CHECKING BETWEEN TWO OR MORE CIRCUIT DESIGNS THAT INCLUDE SQUARE ROOT CIRCUITS

RELATED APPLICATION

This application is a divisional of U.S. application Ser. No. 13/665,827 (now U.S. Pat. No. 9,189,581), by the same inventors, filed on 31 Oct. 2012, the contents of which are herein incorporated by reference. U.S. application Ser. No. 13/665,827 is a continuation-in-part of U.S. application Ser. No. 13/561,895, by the same inventors, filed on 30 Jul. 2012, the contents of which are herein incorporated by reference.

BACKGROUND

Technical Field

This disclosure generally relates to formal verification. More specifically, this disclosure relates to equivalence checking between two or more circuit designs that include division or square root circuits.

Related Art

The importance of circuit verification cannot be over-emphasized. Indeed, without circuit verification it would have been practically impossible to design complicated integrated circuits (ICs) which are commonly found in today's computing devices.

Circuits that perform division and that compute a square root are used extensively in ICs. For example, these circuits are commonly used in central processing units (CPUs), graphics processors, digital signal processors, etc. There have been many cases in which a bug in a circuit implementation of a mathematical operator had a significant impact on the company's finances. For example, in one well-publicized instance, a bug in a floating-point division circuit cost the company hundreds of millions of dollars. Therefore, it is very important to guarantee that certain circuits (e.g., division and square root circuits) in an IC will operate correctly.

An important problem in the area of formal verification involves equivalence checking between two or more circuit designs that are specified at the same or different abstraction levels. For example, equivalence checking can be performed between two register transfer level (RTL) designs or a design that is specified in a high-level programming language (e.g., C++) and an RTL design.

One approach for checking equivalence between two or more circuit designs is to exhaustively simulate the two or more circuit designs over all possible inputs to ensure that the two or more circuit designs produce the same output whenever their inputs are the same. However, this approach is clearly impractical because it is computationally infeasible (and often impossible) to exhaustively simulate non-trivial circuit designs such division circuit designs and square-root circuit designs.

Another approach is to use formal verification to prove equivalence between the two or more circuit designs. Unfortunately, naïve formal verification based approaches can have serious runtime and memory issues when they are used to prove equivalence between two or more circuit designs that include a division circuit and/or a square-root circuit. Hence, what is needed are techniques and systems to efficiently perform formal equivalence checking between two or more circuit designs that include a division circuit and/or a square-root circuit without the above-described problems.

SUMMARY

Some embodiments prove equivalence between two or more circuit designs that include one or more division circuits and/or one or more square-root circuits.

Specifically, some embodiments analyze the first and second circuit designs (which include a division circuit each) to determine an input relationship between a set of inputs of the first division circuit and a set of inputs of the second division circuit. Next, the embodiments determine an output relationship between a set of outputs of the first division circuit and a set of outputs of the second division circuit based on the input relationship. The embodiments then prove equivalence between the first and second circuit designs, wherein said proving involves using the input and output relationships.

In a variation, some embodiments prove correctness of the division circuits before proving equivalence between the circuit designs. If the division circuit is a bit-serial division circuit, then these embodiments can prove correctness as follows. Note that a bit-serial division circuit receives a dividend and a divisor as input, and outputs a w-bit quotient and a remainder by performing an iterative computation. In each iteration of the iterative computation, the bit-serial division circuit design determines b bits of the w-bit quotient, where $b<w$. The embodiments create a set of properties to prove correctness of a bit-serial division circuit design, wherein the set of properties can be efficiently proven using a bit-level solver. The embodiments then formally verify the bit-serial division circuit design using the set of properties.

Some embodiments analyze the first and second circuit designs (which include a square-root circuit each) to determine an input relationship between the square-root operand of the first division circuit and the square-root operand of the second division circuit. Next, the embodiments determine an output relationship between a set of outputs of the first square-root circuit and a set of outputs of the second square-root circuit based on the input relationship. The embodiments then prove equivalence between the first and second circuit designs, wherein said proving involves using the input and output relationships.

In a variation, some embodiments prove correctness of the square-root circuits before proving equivalence between the circuit designs. If the square-root circuit is a bit-serial square-root circuit, then these embodiments can prove correctness as follows. Note that a bit-serial square-root circuit design receives a square-root operand as input, and outputs a w-bit square-root by performing an iterative computation. In each iteration of the iterative computation, the bit-serial square-root circuit design determines b bits of the w-bit square-root, where $b<w$. The embodiments create a set of properties to prove correctness of a bit-serial square-root circuit design, wherein the set of properties can be efficiently proven using a bit-level solver. The embodiments then formally verify the bit-serial square-root circuit design using the set of properties.

BRIEF DESCRIPTION OF THE FIGURES

FIG. 3B presents a flowchart that illustrates a process for proving equivalence between two circuit designs that include square-root circuits in accordance with some embodiments described herein.

FIG. 4 illustrates a process for proving correctness of a bit-serial division circuit design in accordance with some embodiments described herein.

DETAILED DESCRIPTION

Figure 1:
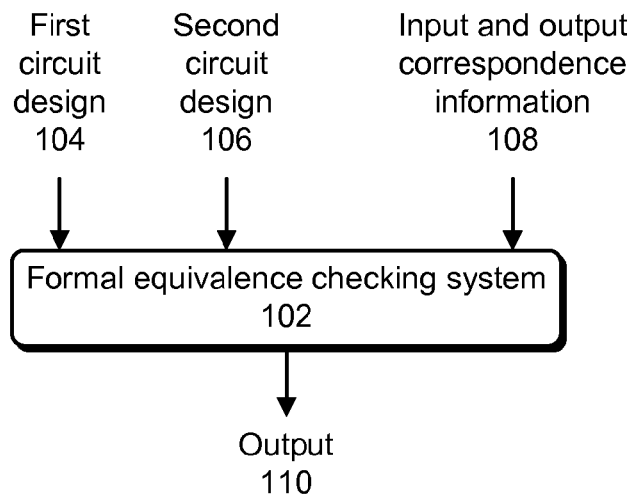
FIG. 1 illustrates a formal equivalence checking system in accordance with some embodiments described herein.

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

Overview of an Electronic Design Automation (EDA) Flow

An EDA flow can be used to create a circuit design. Once the circuit design is finalized, it can undergo fabrication, packaging, and assembly to produce integrated circuit chips. An EDA flow can include multiple steps, and each step can involve using one or more EDA software tools. Some EDA steps and software tools are described below. These examples of EDA steps and software tools are illustrative purposes only and are not intended to limit the embodiments to the forms disclosed.

Some EDA software tools enable circuit designers to describe the functionality that they want to implement. These tools also enable circuit designers to perform what-if planning to refine functionality, check costs, etc. During logic design and functional verification, the HDL (hardware description language), e.g., SystemVerilog, code for modules in the system can be written and the design can be checked for functional accuracy, e.g., the design can be checked to ensure that it produces the correct outputs.

During synthesis and design for test, the HDL code can be translated to a netlist using one or more EDA software tools. Further, the netlist can be optimized for the target technology, and tests can be designed and implemented to check the finished chips. During netlist verification, the netlist can be checked for compliance with timing constraints and for correspondence with the HDL code.

During design planning, an overall floorplan for the chip can be constructed and analyzed for timing and top-level routing. During physical implementation, circuit elements can be positioned in the layout (placement) and can be electrically coupled (routing).

During analysis and extraction, the circuit's functionality can be verified at a transistor level and parasitics can be extracted. During physical verification, the design can be checked to ensure correctness for manufacturing, electrical issues, lithographic issues, and circuitry.

During resolution enhancement, geometric manipulations can be performed on the layout to improve manufacturability of the design. During mask data preparation, the design can be "taped-out" to produce masks which are used during fabrication.

Formal Equivalence Checking

In a circuit design flow, a circuit design is represented at different levels of abstractions. For example, some circuit design flows begin by writing an IC design specification in a high-level programming language, such as C, C++, SystemC, SystemVerilog, etc. Such high-level descriptions of the circuit design are often referred to as a high-level model (HLM) for the IC design. The level of abstraction decreases as the circuit design progresses through the design flow. For example, a circuit design which is represented using an HLM at the beginning of the design flow may be represented using a register-transfer-level (RTL) model at a later stage in the design flow.

Whenever the same circuit design is represented at different levels of abstraction, it is important to verify that the models at different abstraction levels are functionally equivalent. Formal equivalence checking can be used to prove the equivalence between two or more circuit designs at one or more levels of abstraction. For example, embodiments described herein can be used to prove equivalence between two HLMs, two RTL models, or between an HLM and an RTL model of a circuit design that includes one or more division circuits and/or one or more square-root circuits.

FIG. 1 illustrates a formal equivalence checking system in accordance with some embodiments described herein. The formal equivalence checking system 102 receives first circuit design 104 (e.g., a first HLM or RTL model) and second circuit design 106 (e.g., a second HLM or RTL model). Formal equivalence checking system 102 also receives input and output correspondence information 108 that specifies (1) the correspondence between the input(s) of first circuit design 104 and the input(s) of the second circuit design 106, and (2) the correspondence between the output(s) of the first circuit design 104 and the output(s) of the second circuit design 106. For example, suppose the first circuit design has inputs a and b, and the second circuit design has inputs c and d. Then, the correspondence information may specify that input a of the first circuit corresponds to input c of the second circuit and input b of the first circuit corresponds to input d of the second circuit.

Formal equivalence checking system 102 attempts to prove the equivalence between first circuit design 104 and second circuit design 106 based on input and output correspondence information 108, and produces output 110. If formal equivalence checking system 102 is successful in proving equivalence, then output 110 indicates that first circuit design 104 and second circuit design 106 are equivalent. If formal equivalence checking system 102 is able to prove that first circuit design 104 is not equivalent to second circuit design 106 (e.g., by determining one or more counterexample traces in which the two circuit designs produce different outputs for the same input), then output 110 indicates that the two circuit designs are not equivalent, and may provide the counterexample traces, if any. Finally, if formal equivalence checking system 102 is not able to either prove or disprove equivalence between the two circuit designs (e.g., because the formal equivalence checking system ran out of time or memory), then output 110 indicates that the equivalence between the two circuit designs was neither proven nor disproven, and may provide a reason why formal equivalence checking failed.

The runtime and memory resources required by a formal equivalence checking system can be vastly different depending on the functionality of the circuit designs. Specifically, the types of mathematical and/or logical operations that are used in the circuit designs can determine whether or not a formal equivalence checking system is able to prove or disprove the set of properties efficiently. For example, if the circuit designs include a division or a square-root circuit, then conventional formal equivalence checking techniques cannot prove or disprove equivalence between the circuit designs in an efficient manner.

Some embodiments described herein provide systems and techniques that enable a formal equivalence checking tool to prove or disprove equivalence between two or more circuit designs that include one or more division circuit designs and/or one or more square-root circuit designs.

Figure 2A:
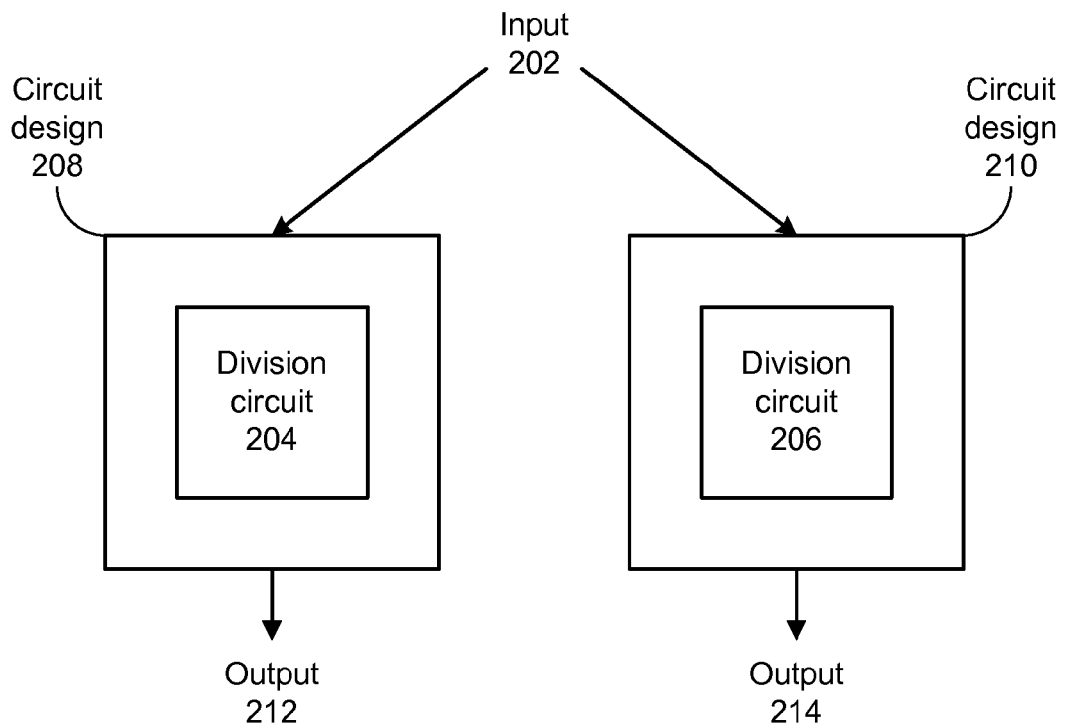
FIG. 2A illustrates how formal equivalence checking can be performed between two circuit designs that include division circuits in accordance with some embodiments described herein.

FIG. 2A illustrates how formal equivalence checking can be performed between two circuit designs that include division circuits in accordance with some embodiments described herein.

Circuit designs 208 and 210 include division circuits 204 and 206, respectively. To formally prove equivalence between circuit designs 208 and 210, we have to prove that, when the same input 202 is provided to circuit designs 208 and 210, the circuit designs produce the same outputs, i.e., outputs 212 and 214 are the same. When circuit designs 208 and 210 include division circuits (e.g., division circuits 204 and 206), then conventional formal equivalence checking systems are very inefficient, e.g., they take a long time to run and require large amounts of memory.

A division circuit takes two inputs, namely the dividend (X) and the divisor (D), and produces two outputs, namely the quotient (Q) and the remainder (R). Note that the dividend and divisor that are provided to division circuit 204 are based on input 202. Similarly, the dividend and divisor that are provided to division circuit 206 are also based on input 202. However, circuit designs 208 and 210 may perform different transformations on input 202 to obtain different dividend and divisor values that are then inputted into division circuits 204 and 206. In other words, even though the same input—input 202—is provided to circuit designs 308 and 310, the inputs that are provided to the division circuits 204 and 206 can be different. Some embodiments analyze circuit designs 208 and 210 to determine a relationship between the dividend inputs of circuits 204 and 206, and between the divisor inputs of circuits 204 and 206.

Specifically, some embodiments receive the input and output correspondence information for the two division circuits. The correspondence information specifies which inputs of division circuit 204 correspond to which inputs of division circuit 206, and which outputs of division circuit 204 correspond to which outputs of division circuit 206. Note that the correspondence information does not specify the mathematical relationship between the inputs of the two division circuits, nor does it specify the mathematical relationship between the outputs of the two division circuits. The mathematical relationships are determined automatically by the embodiments as described in this disclosure.

Once we know the relationship between the inputs of division circuit 204 and the inputs of division circuit 206, we can determine a relationship between the outputs of division circuit 204 and the outputs of division circuit 206. The techniques and systems described in this disclosure for determining the output relationship based on the input relationship for a division circuit are not known in the art, and are not obvious. Once the input and output relationships have been determined, they can be used to efficiently prove equivalence between circuit designs 208 and 210.

Figure 2B:
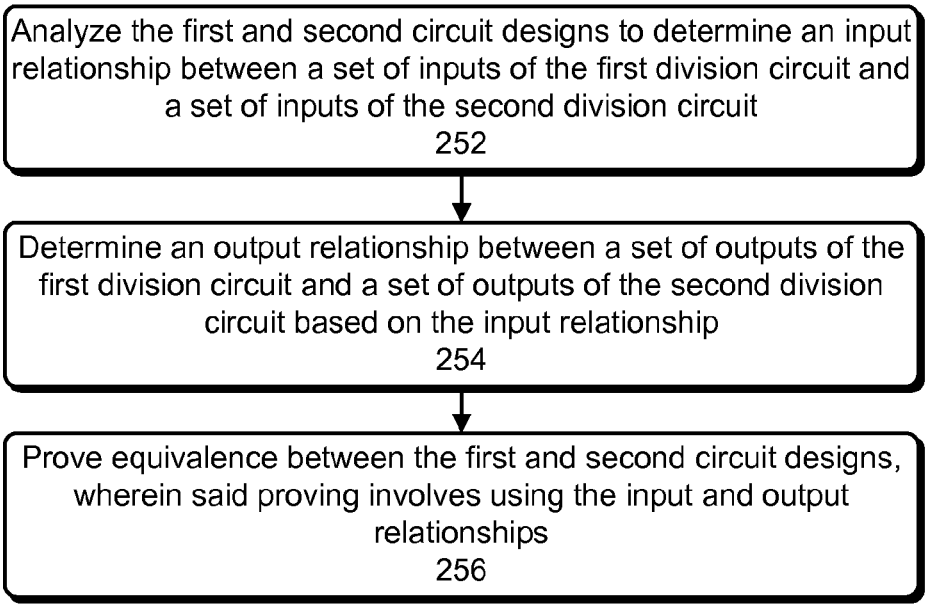
FIG. 2B presents a flowchart that illustrates a process for proving equivalence between two circuit designs that include division circuits in accordance with some embodiments described herein.

FIG. 2B presents a flowchart that illustrates a process for proving equivalence between two circuit designs that include division circuits in accordance with some embodiments described herein. The process illustrated in FIG. 2B is generally applicable to any circuit that implements a division operation.

The process begins by a system analyzing the first and second circuit designs to determine an input relationship between a set of inputs of the first division circuit and a set of inputs of the second division circuit (operation 252). In some embodiments, the set of inputs of the first division circuit include dividend c and divisor d, the set of inputs of the second division circuit include dividend e and divisor f, and dividend of one circuit is a multiple of dividend of the other circuit (that is, c divides e or e divides c) and divisor of one circuit is a multiple of divisor of other circuit (that is, d divides f or f divides d).

Next, the system determines an output relationship between a set of outputs of the first division circuit and a set of outputs of the second division circuit based on the input relationship (operation 254). The system then proves equivalence between the first and second circuit designs, wherein said proving involves using the input and output relationships (operation 256). More specifically, the output relationship between the two division circuits is used as an assumption to prove the equivalence between the first and second circuit designs.

In some embodiments, prior to proving equivalence between the first and second circuit designs, the method comprises proving correctness of the first and second division circuits, i.e., formally proving that the division circuits implement mathematical division operations. If formal verification of one or both division circuits fails, the system can terminate the process and not perform formal equivalence checking between the two circuit designs. If one or both division circuits are bit-serial division circuits, then the techniques and systems described below in reference to FIG. 4 can be used to efficiently verify the correctness of the bit-serial division circuit(s).

Figure 3A:
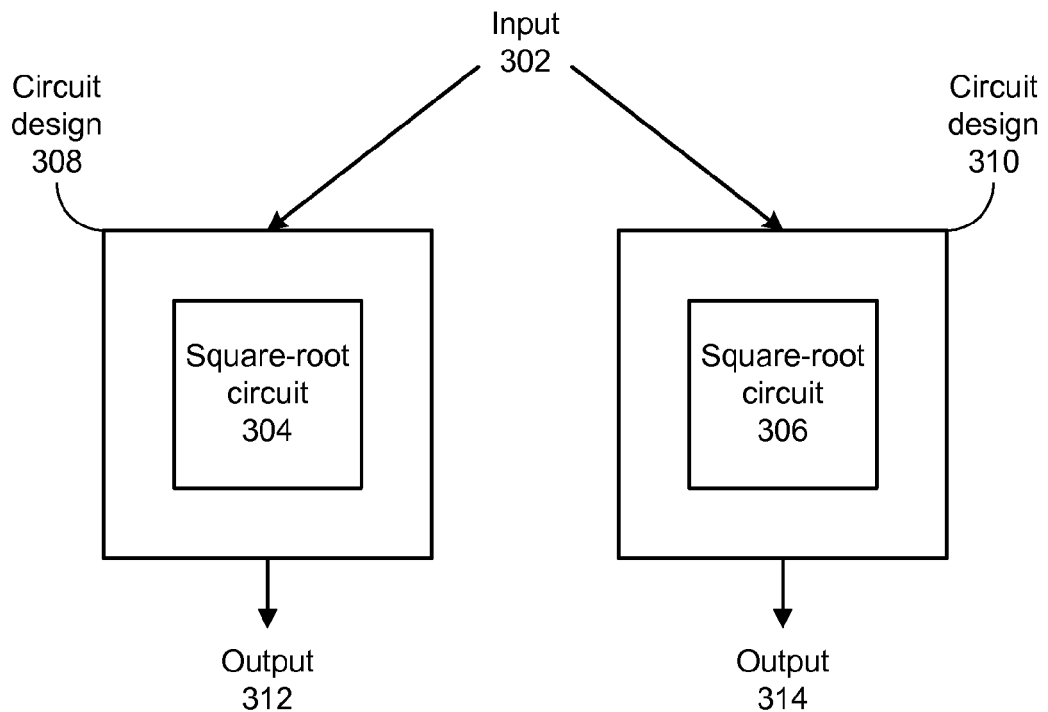
FIG. 3A illustrates how formal equivalence checking can be performed between two circuit designs that include square-root circuits in accordance with some embodiments described herein.

FIG. 3A illustrates how formal equivalence checking can be performed between two circuit designs that include square-root circuits in accordance with some embodiments described herein.

Circuit designs 308 and 310 include square-root circuits 304 and 306, respectively. To formally prove equivalence between circuit designs 308 and 310, we have to prove that, when the same input 302 is provided to circuit designs 308 and 310, the circuit designs produce the same outputs, i.e., outputs 312 and 314 are the same. When circuit designs 308 and 310 include square-root circuits (e.g., square-root circuits 304 and 306), then conventional formal equivalence checking systems are very inefficient, e.g., they take a long time to run and require large amounts of memory.

A square-root circuit takes one input (X) and produces one output (Q). Note that the square-root operand (i.e., X) that is provided to square-root circuit 304 is based on input 302. Similarly, the square-root operand that is provided to square-root circuit 306 is also based on input 302. However, circuit designs 308 and 310 may perform different transformations on input 302 to obtain the square-root operands that are provided as inputs to square-root circuits 304 and 306. Thus, the square-root inputs to square-root circuits 304 and 306 may not be equal. Some embodiments analyze circuit designs 308 and 310 to determine a relationship between the square-root operand of square-root circuit 304 and the square-root operand of square-root circuit 306. Some embodiments can also receive the input and output correspondence information for the two square-root circuits. The correspondence information specifies which inputs of square-root circuit 304 correspond to which inputs of square-root circuit 306, and also which outputs of square-root circuit 304 correspond to which outputs of square-root circuit 306. Note that the correspondence information does not specify the mathematical relationship between the inputs of the two square-root circuits, nor does it specify the mathematical relationship between the outputs of the two square-root circuits. The mathematical relationships are determined automatically by the embodiments as described in this disclosure.

Once we know the relationship between the input of square-root circuit 304 and the input of square-root circuit 306, we can determine a relationship between the outputs of square-root circuit 304 and the outputs of square-root circuit 306. The techniques and systems described in this disclosure for determining the output relationship based on the input relationship for a square-root circuit are not known in the art, and are not obvious. Once the input and output relationships have been determined, they can be used to efficiently prove equivalence between circuit designs 308 and 310.

FIG. 3B presents a flowchart that illustrates a process for proving equivalence between two circuit designs that include square-root circuits in accordance with some embodiments described herein. The process illustrated in FIG. 3B is generally applicable to any circuit that implements a square-root operation.

The process begins by a system analyzing the first and second circuit designs to determine an input relationship between the square-root operand of the first square-root circuit and the square-root operand of the second square-root circuit (operation 352). In some embodiments, the input relationship is of the form $c = a \cdot m^2$, where a is the square-root operand of the first square-root circuit, c is the square-root operand of the second square-root circuit, and m is an integer.

Next, the system determines an output relationship between a set of outputs of the first square-root circuit and a set of outputs of the second square-root circuit based on the input relationship (operation 354). The system then proves equivalence between the first and second circuit designs, wherein said proving involves using the input and output relationships (operation 356).

In some embodiments, prior to proving equivalence between the first and second circuit designs, the method comprises proving correctness of the first and second square-root circuits, i.e., formally proving that the square-root circuits implement mathematical square root operations. If formal verification of one or both of the square-root circuits fails, the system can terminate the process and not perform formal equivalence checking between the two circuit designs. If one or both square-root circuits are a bit-serial square-root circuits, then the techniques and systems described below in reference to FIG. 5 can be used to efficiently verify the correctness of the bit-serial square-root circuit(s).

Determining the Output Relationship Between Two Division Circuits

Given two unsigned integers a and b, the result of integer division of a by b is quotient q that satisfies the following relationship: $qb \leq a < q(b+1)$. The remainder r for a division operation is defined as $r = a - qb$, where q is the quotient when dividing a by b. Note that it is easily shown that $r \geq 0$ and $r < b$.

Note that both q and r are uniquely defined, i.e., if we are given non-negative integers a, $b \neq 0$, $q_1$, $r_1$, $q_2$, and $r_2$, that satisfy the following equations: $a = q_1 b + r_1$, $a = q_2 b + r_2$, $r_1 < b$, and $r_2 < b$, then the following must be true: $q_1 = q_2$ and $r_1 = r_2$. This property is called the "division uniqueness property" in this disclosure.

Now, suppose we are given two division circuits. The first circuit divides c by d to produce quotient $q_1$ and remainder $r_1$, and the second circuit divides e by f to produce quotient $q_2$ and remainder $r_2$ where c, $d \neq 0$, e, $f \neq 0$, $q_1$, $r_1$, $q_2$, $r_2$ are non-negative integers. Based on the definition of the division operation, the first and second division circuit satisfy the following relationships: $c = q_1 d + r_1$, $r_1 < d$, $e = q_2 f + r_2$, and $r_2 < f$. Furthermore, suppose e divides c, i.e., $c = te$, where t is a positive integer. Then, the output relationship (i.e., the relationship between $q_1$, $q_2$, $r_1$, and $r_2$) is as follows: (1) for the case when d divides f, i.e., $f = sd$, where s is a positive integer, $$q_2 = \left\lfloor \frac{q_1}{st} \right\rfloor,$$

and $r_1 = tr_2 - d\beta$, where $$\beta = q_1 - st \left\lfloor \frac{q_1}{st} \right\rfloor,$$

and (2) for the case when f divides d, i.e., $d = sf$, where s is a positive integer, $$q_2 = \left\lfloor \frac{sq_1}{t} \right\rfloor,$$

and $r_1 = tr_2 - d\beta$, where $$\beta = sq_1 - t \left\lfloor \frac{sq_1}{t} \right\rfloor.$$

The output relationship can be proven as follows. We are given that e divides c, i.e., $c = te$, where t is a positive integer. Now consider the case when d divides f (the other case, i.e., when f divides d can be proven in a similar fashion). Multiplying both sides of the equation $e = q_2 f + r_2$ by t give us $te = tq_2 f + tr_2$. Substituting for te we get $c = tq_2 f + tr_2$. Since $f = sd$, we get $c = tq_2 sd + tr_2$, which can be rewritten as $c = stq_2 d + tr_2$. Given an integer x, this equation can be written as $c = (stq_2 + x)(d) + tr_2 - dx$.

Now, define $S = \{x | x \in Z, x \geq 0, tr_2 - dx \leq 0\}$. Since $0 \in S$, S is a non-empty set. For each $x \in S$, $$x \leq \frac{tr_2}{d} < \frac{tf}{d} = st$$

(since $r_2 < f$ and $f = sd$). In other words, for each $x \in S$, we have $x < st$.

Let $\beta$ denote the maximum element in S. Note that $stq_2 + \beta$ is the quotient and $(tr_2 - d\beta)$ is the remainder for integer division of c by d because: (1) $tr_2 - d\beta > 0$ (this follows from the fact that $\beta \in S$), and (2) $tr_2 - d\beta < d$ (this can be easily shown by using proof by contradiction). Now, by using the division uniqueness property and the fact that $\beta < st$, we get $$q_2 = \left\lfloor \frac{q_1}{st} \right\rfloor,$$

and $r_1 = t\ r_2 - d\beta$, where $$\beta = q_1 - st \left\lfloor \frac{q_1}{st} \right\rfloor,$$

Determining the Output Relationship Between Two Square-Root Circuits

Given an integer $a \geq 0$, the integer square-root of a is a number q that satisfies the following relationship: $q^2 \leq a < (q+1)^2$. The remainder for a square-root operation is defined to be $r = a - q^2$, wherein $a \geq 0$ and q is the square root of a. Note that it is easily shown that $r \geq 0$ and $r < (2q+1)$.

Note that both q and r are uniquely defined, i.e., if we are given non-negative integers $a$, $q_1$, $r_1$, $q_2$, and $r_2$ that satisfy the following equations: $a = q_1^2 + r_1$, $a = q_2^2 + r_2$, $r_1 < 2q_1 + 1$, and $r_2 < 2q_2 + 1$, then the following must hold: $q_1 = q_2$ and $r_1 = r_2$. This is called the square-root uniqueness property in this disclosure.

Now suppose we are given non-negative integers $a$, $q_1$, $r_1$, $q_2$, $r_2$ and m that satisfy the following equations: $a = q_1^2 + r_1$, $am^2 = q_2^2 + r_2$, $r_1 < 2q_1 + 1$, and $r_2 < 2q_2 + 1$, then the output relationship (i.e., the relationship between $q_1$, $q_2$, $r_1$, and $r_2$) is as follows:

$$q_1 = \left\lfloor \frac{q_2}{m} \right\rfloor,$$

and $r_2 = m^2 r_1 - \gamma^2 - 2mq_1\gamma$, where $$\gamma = q_2 - m \left\lfloor \frac{q_2}{m} \right\rfloor.$$

The output relationship can be proven as follows. Let $S = \{x | x \in Z, x \geq 0, m^2 r_1 - x^2 - 2mq_1 x \geq 0\}$. Note that $0 \in S$, and therefore S is a non-empty set. We can prove that each element in S is less than m by using proof by contradiction. Let $\beta$ denote the maximum element in S. Consider the following equation that can be readily derived from the above-described equations:

$$m^2 a = (mq_1 + \beta)^2 + m^2 r_1 - \beta^2 - 2q_1 m\beta.$$

We can show that $mq_1 + \beta$ is the integer square-root of $m^2 a$ and $m^2 r_1 - \beta^2 - 2q_1 m\beta$ is the remainder by noting the following: (1) $m^2 r_1 - \beta^2 - 2q_1 m\beta \geq 0$ (this follows from the definition of $\beta \in S$), and (2) $(m^2 r_1 - \beta^2 - 2q_1 m\beta) < 2(mq_1 + \beta) + 1$ (this can be easily shown by using proof by contradiction). Now, by using the square-root uniqueness property and the fact that $\beta < m$, we get $$q_1 = \left\lfloor \frac{q_2}{m} \right\rfloor,$$

and $r_2 = m^2 r_1 - \gamma^2 - 2mq_1\gamma$, where $$\gamma = q_2 - m \left\lfloor \frac{q_2}{m} \right\rfloor.$$

Formal Verification of Bit-Serial Division Circuit Designs

As mentioned above, a division circuit design takes two inputs, namely the dividend (X) and the divisor (D), and produces two outputs, namely the quotient (Q) and the remainder (R). Proving the following set of properties is sufficient to prove that an implementation of a division circuit design operates correctly:

$X = Q \times D + R$, and $R < D.$ (1)

In the above equation, X, D, Q, and R are non-negative integers. Extending the equation to signed numbers will be apparent to a person having ordinary skill in the art. Specifically, in some implementations, the absolute values of X and D are used in the division, and then appropriate signs (i.e., positive or negative) are attached to the quotient and remainder based on the signs of dividend and the divisor. A bit-serial division circuit design implements an iterative process to determine the quotient and the remainder. In each iteration, one or more bits of the quotient are determined. For example, in some embodiments, a single bit of the quotient is determined in each iteration by the bit-serial division circuit design. In each iteration, a partial remainder is maintained. At the end of the last iteration the partial remainder becomes equal to the actual remainder.

A bit-serial division process determines the bits of the quotient by starting from the most significant bit and then progressively moving toward the least significant bit in each iteration. For example, in embodiments where a single bit is determined in each iteration, the first iteration (i.e., i=1) determines the most significant bit of Q, and the last iteration determines the least significant bit of Q. In embodiments where b bits are determined in each iteration, the first iteration (i.e., i=1) determines the b most significant bits of Q, the second iteration (i.e., i=2) determines the next b most significant bits of Q, and so forth until all bits of Q have been determined. In each iteration, a partial remainder is maintained. At the start of the first iteration, the partial remainder is equal to the dividend. The partial remainder reduces in value in each iteration and converges to the correct remainder in the last iteration.

Let Q[i] and R[i] denote the partial quotient and partial remainder, respectively, in iteration i. In other words, Q[i] represents the value of the quotient Q in iteration i of the iterative bit-serial division process. Likewise, R[i] represents the value of the remainder R in iteration i of the iterative bit-serial division process. As the iterative process progresses, the values of the partial quotient Q[i] and the partial remainder R[i] change, and they become equal to the quotient and the remainder after the last iteration is completed.

Suppose the quotient Q is w-bits wide. Let us assume that, in each iteration, the bit-serial division process determines b bits of the quotient Q. In these embodiments, the bit-serial division process will require $$k = \left\lceil \frac{w}{b} \right\rceil$$

iterations to determine the final value for the quotient and the remainder.

The following discussion assumes, without loss of generality, that b=1. It will be apparent to those skilled in the art that the systems and techniques described in this disclosure can also be used for bit-serial division circuit designs in which b>1.

The following set of properties can be used to prove correctness of a bit-serial division circuit design:

$$X=Q[i]\times D+R[i], \text{ and} \quad (2)$$

$$R[i]<(2^{k-i}\times D). \quad (3)$$

The sets of properties (2) and (3) shown above are proven for $\forall i$, $0 \le i \le k$. Note that, since b=1, k=w. When i=0, it is assumed that Q[0]=0 and R[0]=X. The term Q[i]×D uses a word-level multiplication operator which causes performance problems in formal verification systems that use bit-level solvers. Note that the word-level multiplication $2^{k-i} \times D$ that is used in the set of properties (3) can be performed by using a left-shift operation, and therefore does not cause performance problems during formal verification when bit-level solvers are used.

In lieu of the set of properties (2) shown above, some embodiments described herein use a different set of properties that can be proven or disproven efficiently by using a bit-level solver. Specifically, let q[j] be the $j^{th}$ bit of quotient Q, where q[0] is the least significant bit of Q and q[k−1] is the most significant bit of Q (recall that since b=1, therefore k=w, where w is the number of bits in Q). Some embodiments described herein use the following set of properties in lieu of the set of properties (2) to prove correctness of a bit-serial division circuit design:

$$\begin{aligned} X &= R[0], \\ R[0] &= (q[k-1] \times 2^{k-1}) \times D + R[1], \\ R[1] &= (q[k-2] \times 2^{k-2}) \times D + R[2], \\ &\vdots \\ R[k-1] &= (q[0] \times 2^0) \times D + R[k]. \end{aligned} \quad (4)$$

Note that bit q[k−i] is equal to either 0 or 1, and so the expression $q[k-i] \times 2^{k-i}$ is equal to either 0 or $2^{k-i}$. Therefore, the word-level multiplication $(q[k-i] \times 2^{k-i}) \times D$ can be performed by using a left-shift operation when q[k−i] is equal to 1. For this reason, the expression $(q[k-i] \times 2^{k-i}) \times D$ does not cause performance problems during formal verification.

An important insight that was used to arrive at the set of properties (4) shown above is as follows. From the set of properties (2) we know that X=Q[i−1]×D+R[i−1] and X=Q[i]×D+R[i]. Substituting the value of X from the first equation into the second equation, we get Q[i−1]×D+R[i−1]=Q[i]×D+R[i]. After rearranging the terms, we get R[i−1]=(Q[i]−Q[i−1])×D+R[i]. Note that (Q[i]−Q[i−1]) is a binary value in which all bits are equal to zero except possibly the bit q[k−i] that was determined in the $i^{th}$ iteration. In other words, $Q[i]-Q[i-1]=q[k-i] \times 2^{k-i}$. This is an important insight that is used by some embodiments described herein.

Another important insight is that the set of properties (4) are equivalent to set of properties (2). This can be readily verified by summing the left hand sides and the right hand sides of the equations shown in the set of properties (4), and then canceling terms that appear on both sides of the equation. The partial remainder terms R[0], . . . , R[k−1] cancel out, and we get:

$$X=(q[k-1]\times 2^{k-i})\times D+ \ldots +(q[0]\times 2^0)\times D+R[k]=Q[k]\times D+R[k]. \quad (5)$$

FIG. 4 illustrates a process for proving correctness of a bit-serial division circuit design in accordance with some embodiments described herein. The bit-serial division circuit design receives a dividend and a divisor as input, and outputs a w-bit quotient and a remainder by performing an iterative computation. In each iteration of the iterative computation, the bit-serial division circuit design determines b bits of the w-bit quotient. The bit-widths used above are for illustration purposes only and are not intended to restrict the embodiments to the forms disclosed. It will be apparent to those having ordinary skill in the art that the systems and techniques described in this disclosure can also be used for proving bit-serial division circuit designs in which the bit-widths of dividend and divisor are different from the bit-widths used in this disclosure.

The process begins by creating a set of properties to prove correctness of the bit-serial division circuit design, wherein the set of properties are capable of being efficiently proven by using a bit-level solver (process block 402). Specifically, in some embodiments, the set of properties does not include any terms that multiply a w-bit partial quotient with the divisor. For example, the set of properties (3)-(4) shown above does not include any terms that multiply a w-bit partial quotient with the divisor. Next, formal verification is performed on the bit-serial division circuit design by attempting to prove the set of properties (process block 404).

In some embodiments, the set of properties includes terms that multiply a b-bit value (i.e., the b bits of the quotient that were determined in the current iteration) with the divisor. Note that $1 \le b < w$. When b=1, the set of properties only includes terms that are capable of being evaluated using an addition operation and a left-shift operation.

In some embodiments, a bit-level solver is used to prove the set of properties. The term "bit-level solver" generally refers to any system that uses a bit-level computational model to prove or disprove a set of properties. Examples of bit-level solvers include, but are not limited to, BDD-based solvers and satisfiability (SAT)-based solvers.

The systems and techniques described herein are applicable to both restoring and non-restoring bit-serial division circuit designs. The set of properties (4) shown above correspond to a restoring bit-serial division circuit design.

In a restoring bit-serial division, the partial remainder is always non-negative. In a non-restoring bit-serial division, the partial remainders can become negative. Let NQ[i] and NR[i] denote the quotient and the remainder, respectively, in a non-restoring bit-serial division circuit design. In non-restoring bit-serial division circuit designs, additional logic is added to the circuit design to derive restoring quotient Q[i] and restoring remainder RN from NQ[i] and NR[i]. The additional logic does not change the functionality of the original design. The values Q[i] and RN are then used to prove the set of properties (3)-(4) shown above.

Formal Verification of Bit-Serial Square-Root Circuit Designs

As mentioned above, a square-root circuit design takes one input (X) and produces one output (Q). Proving the following property is sufficient to prove that an implementation of a square-root circuit design operates correctly:

$$Q^2 \le X < (Q+1)^2. \quad (6)$$

Property (6) shown above is equivalent to the following set of properties where R denotes the remainder:

$$X=Q^2+R,$$

$$0 \le R < (2 \cdot Q+1). \quad (7)$$

A bit-serial square-root circuit design implements an iterative process to determine the square-root (Q). In each iteration, one or more bits of the square-root are determined. For example, in some embodiments, a single bit of Q is determined in each iteration by the bit-serial square-root circuit design. In each iteration, a partial remainder is maintained. At the end of the last iteration the partial remainder becomes equal to the remainder (denoted by R in set of properties (7)).

A bit-serial square-root process determines the bits of the square-root by starting from the most significant bit and then progressively moving toward the least significant bit in each iteration. For example, in embodiments where a single bit is determined in each iteration, the first iteration (i.e., i=1) determines the most significant bit of Q, and the last iteration determines the least significant bit of Q. In embodiments where b bits are determined in each iteration, the first iteration (i.e., i=1) determines the b most significant bits of Q, the second iteration (i.e., i=2) determines the next b most significant bits of Q, and so forth until all bits of Q have been determined. In each iteration, a partial remainder is maintained. At the start of the first iteration the partial remainder is equal to the input X. The partial remainder reduces in value in each iteration and converges to the correct remainder in the last iteration.

Let Q[i] and RN denote the partial square-root and partial remainder, respectively, corresponding to iteration i. In other words, Q[i] represents the value of the square-root Q in iteration i of the iterative bit-serial division process. As the iterative process progresses, the value of the partial square-root Q[i] changes, and it becomes equal to the square root of the input (X) after the last iteration is completed. Likewise, the value of the partial remainder RN changes as the iteration progresses, and becomes equal to the remainder (R) after the last iteration is completed.

Suppose the square-root Q is a w-bit value. Let us assume that, in each iteration, the bit-serial square-root process determines b bits of the square-root Q. In these embodiments, the bit-serial square-root process will require $$k = \left\lceil \frac{w}{b} \right\rceil$$

iterations to determine the final value of the square-root.

The following discussion assumes, without loss of generality, that b=1. It will be apparent to those skilled in the art that the systems and techniques described in this disclosure can also be used for bit-serial square-root circuit designs in which b>1.

The following set of properties can be used to prove correctness of a bit-serial square-root circuit design:

$$X = (Q[i])^2 + R[i], \quad (8)$$

$$R[i] < ((2 \times Q[i] + 1) \times 2^{2k-2i}), \quad (9)$$

$$R[i] \geq 0. \quad (10)$$

The sets of properties (8)-(10) shown above are proven for $\forall i$, $0 \leq i \leq k$. Note that, since b=1, k=w. When i=0, it is assumed that Q[0]=0 and R[0]=X. The term $(Q[i])^2$ uses a word-level multiplication operator which causes performance problems in formal verification systems that use bit-level solvers. Note that the term $((2 \times Q[i]+1) \times 2^{2k-2i})$ does not cause performance problems during formal verification because multiplication by a power of 2 can be performed by using a left-shift operation.

In lieu of the set of properties (8) shown above, some embodiments described herein use a different set of properties that can be proven or disproven efficiently by using a bit-level solver. Specifically, let q[j] be the $j^{th}$ bit of square-root Q, where q[0] is the least significant bit of Q and q[k−1] is the most significant bit of Q (recall that since b=1, therefore k=w, where w is the number of bits in Q). Some embodiments described herein use the following set of properties in lieu of set of properties (8) to prove correctness of a bit-serial square-root circuit design:

$$X = R[0], \quad (11)$$

$$R[0] = (q[k-1] \times (2 \cdot Q[0] + q[k-1] \cdot 2^{k-1}) \times 2^{k-1}) + R[1],$$

$$R[1] = (q[k-2] \times (2 \cdot Q[1] + q[k-2] \cdot k^{k-2}) \times 2^{k-2}) + R[2],$$

$$\vdots$$

$$R[i-1] = (q[k-i] \times (2 \cdot Q[i-1] + q[k-i] \cdot 2^{k-i}) \times 2^{k-i}) + R[i],$$

$$\vdots$$

$$R[k-1] = (q[0] \times (2 \cdot Q[k-1] + q[0] \cdot 2^0) \times 2^0) + R[k].$$

The set of properties (11) shown above is proven for $\forall i$, $1 \leq i \leq k$. Note that bit q[k−i] is equal to either 0 or 1, and so the expression $(q[k-i] \times (2 \cdot Q[i-1]+q[k-i] \cdot 2^{k-i}) \times 2^{k-i})$ involves a multiplication by a power of 2 when q[k−i] is equal to 1, and therefore can be evaluated by using a left-shift operation. Hence, the expression $(q[k-i] \times (2 \cdot [i-1]+q[k-i] \cdot 2^{k-i}) \times 2^{k-i})$ does not cause performance problems during formal verification when bit-level solvers are used.

Some important insights that were used to arrive at the set of properties (11) shown above are as follows. From the set of properties (8) we know that $X=(Q[i-1])^2+R[i-1]$ and $X=(Q[i])^2+R[i]$. Substituting the value of X from the first equation into the second equation, we get $(Q[i-1])^2+R[i-1]=(Q[i])^2+R[i]$. After rearranging the terms, we get $R[i-1]=((Q[i])^2-(Q[i-1])^2)+R[i]$. Rewriting the expression $(Q[i])^2-(Q[i-1])^2$, we obtain $R[i-1]=(Q[i]+Q[i-1]) \times (Q[i]-Q[i-1])+R[i]$. Note that $(Q[i]-Q[i-1])$ is equal to a binary value in which all bits are equal to zero except possibly the bit q[k−i] that was determined in the $i^{th}$ iteration. In other words, $Q[i]-Q[i-1]=q[k-i] \times 2^{k-i}$. Furthermore, note that $(Q[i]+Q[i-1])$ is equal to $(2 \cdot Q[i-1]+q[k-i] \cdot 2^{k-i})$, which leads us to the set of properties (11) shown above.

Another important insight is that the set of properties (11) are equivalent to set of properties (8). This can be readily verified by summing the left hand sides and the right hand sides of the equations shown in the set of properties (11), and then canceling terms that appear on both sides of the equation. The partial remainder terms R[0], . . . , R[k−1] cancel out, and we are left with $X=(Q[k])^2+R[k]$.

Figure 5:
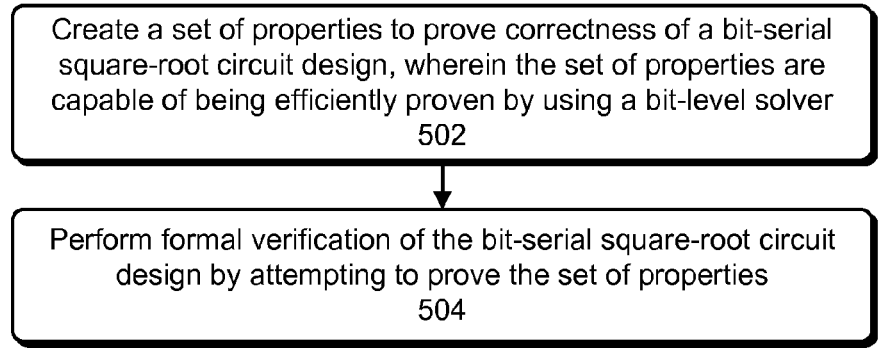
FIG. 5 illustrates a process for proving correctness of a bit-serial square-root circuit design in accordance with some embodiments described herein.

FIG. 5 illustrates a process for proving correctness of a bit-serial square-root circuit design in accordance with some embodiments described herein. The bit-serial square-root circuit design receives a 2w-bit value as input, and outputs a w-bit square-root by performing an iterative computation. In each iteration of the iterative computation, the bit-serial square-root circuit design determines b bits of the w-bit square-root.

The process begins by creating a set of properties to prove correctness of the bit-serial square-root circuit design, wherein the set of properties are capable of being efficiently proven by using a bit-level solver (process block 502). In some embodiments, the set of properties does not include any terms that compute a square of a w-bit partial square-root. For example, the set of properties (9)-(11) shown above does not include any terms that compute a square of a w-bit partial square-root. Next, formal verification is performed on the bit-serial square-root circuit design by attempting to prove the set of properties (process block 504).

In some embodiments, the set of properties includes terms that multiply a b-bit value (i.e., the b bits of the partial square-root that were determined in the current iteration) with the w-bit partial square-root. Note that 1≤b<w. When b=1, the set of properties only includes terms that are capable of being evaluated using an addition operation and a left-shift operation.

In a restoring bit-serial square root computation, the partial remainder is always non-negative. In a non-restoring bit-serial square root computation, the partial remainders can become negative. Let NQ[i] and NR[i] denote the quotient and the remainder, respectively, in a non-restoring bit-serial square root circuit design. In non-restoring bit-serial square root circuit designs, additional logic is added to the circuit design to derive restoring quotient Q[i] and restoring remainder RN from NQ[i] and NR[i]. The additional logic does not change the functionality of the original design. The values Q[i] and RN are then used to prove the set of properties (9)-(11) shown above.

Computer System

Figure 6:
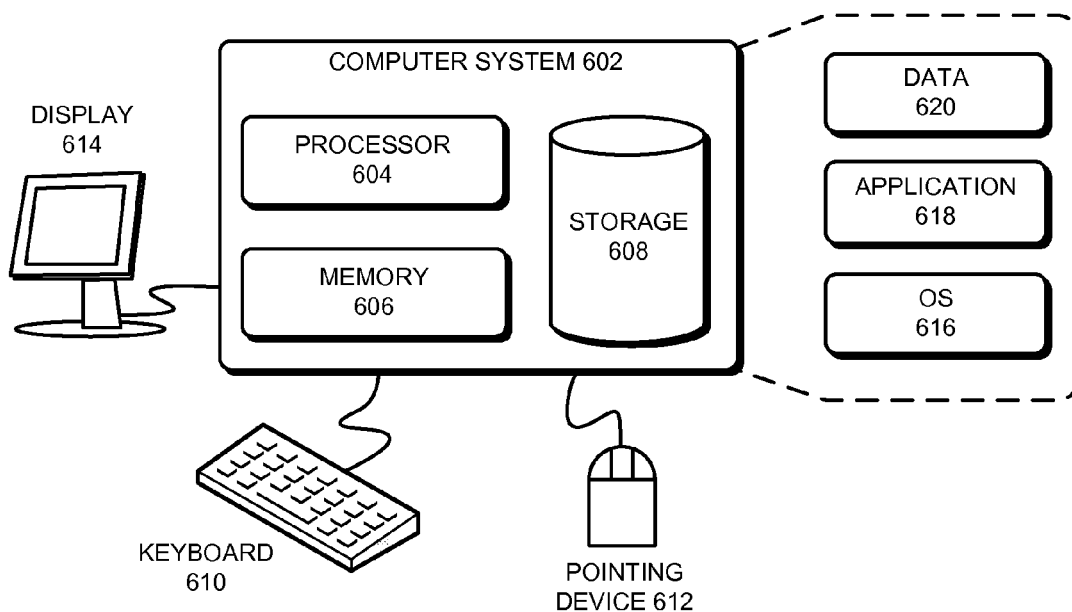
FIG. 6 illustrates a computer system in accordance with some embodiments described in this disclosure.

FIG. 6 illustrates a computer system in accordance with some embodiments described in this disclosure. Computer system 602 can include processor 604, memory 606, and storage device 608. Computer system 602 can be coupled to display device 614, keyboard 610, and pointing device 612. Storage device 608 can store operating system 616, application 618, and data 620. Data 620 can include input required by application 618 and/or output generated by application 618.

Computer system 602 may automatically perform any method that is implicitly or explicitly described in this disclosure. Specifically, during operation, computer system 602 can load application 618 into memory 606. Application 618 can then be used by a user to create input and output correspondence information. Next, application 618 can be used to perform formal equivalence checking between two or more circuit designs that include one or more division circuits and/or one or more square-root circuits.

CONCLUSION

The above description is presented to enable any person skilled in the art to make and use the embodiments. Various modifications to the disclosed embodiments will be readily apparent to those skilled in the art, and the general principles defined herein are applicable to other embodiments and applications without departing from the spirit and scope of the present disclosure. Thus, the present invention is not limited to the embodiments shown, but is to be accorded the widest scope consistent with the principles and features disclosed herein.

The data structures and code described in this disclosure can be partially or fully stored on a computer-readable storage medium and/or a hardware module and/or hardware apparatus. A computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described in this disclosure include, but are not limited to, application-specific integrated circuits (ASICs), field-programmable gate arrays (FPGAs), dedicated or shared processors, and/or other hardware modules or apparatuses now known or later developed.

The methods and processes described in this disclosure can be partially or fully embodied as code and/or data stored in a computer-readable storage medium or device, so that when a computer system reads and executes the code and/or data, the computer system performs the associated methods and processes. The methods and processes can also be partially or fully embodied in hardware modules or apparatuses, so that when the hardware modules or apparatuses are activated, they perform the associated methods and processes. Note that the methods and processes can be embodied using a combination of code, data, and hardware modules or apparatuses.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. In an electronic design automation (EDA) tool in a computer, a method for proving equivalence between a first circuit design and a second circuit design, wherein the first circuit design includes a first square-root circuit and the second circuit design includes a second square-root circuit, the method comprising:

the EDA tool in the computer analyzing the first and second circuit designs to determine an input relationship between the square-root operand of the first square-root circuit and the square-root operand of the second square-root circuit, wherein the square-root operand of the first square-root circuit is not equal to the square-root operand of the second square-root circuit, and wherein the input relationship is of the form $c = a \cdot m^2$, where a is the square-root operand of the first square-root circuit, c is the square-root operand of the second square-root circuit, and m is an integer;

the EDA tool in the computer determining an output relationship between a set of outputs of the first square-root circuit and a set of outputs of the second square-root circuit based on the input relationship; and the EDA tool in the computer proving equivalence between the first and second circuit designs by using the input and output relationships, wherein using the input and output relationships to prove equivalence improves performance of the EDA tool in the computer.

2. The method of claim 1, wherein prior to proving equivalence between the first and second circuit designs, the method comprises the EDA tool in the computer proving correctness of the first and second square-root circuits.

3. The method of claim 2, wherein the first and second square-root circuits are bit-serial square-root circuits, and wherein proving correctness of a bit-serial square-root circuit comprises:

the EDA tool in the computer creating a set of properties to prove correctness of the bit-serial square-root circuit, wherein the set of properties can be efficiently proven by using a bit-level solver, wherein the bit-serial square-root circuit outputs a w-bit square-root by performing an iterative computation, and wherein in each iteration of the iterative computation, the bit-serial square-root circuit determines v bits of the w-bit square-root, wherein v is less than w; and the EDA tool in the computer performing formal verification of the bit-serial square-root circuit by attempting to prove the set of properties using the bit-level solver.

4. The method of claim 3, wherein the set of properties does not include any terms that compute a square of a w-bit partial square-root.

5. The method of claim 3, wherein the set of properties includes terms that multiply v bits of a w-bit partial square-root that were determined in a given iteration with the w-bit partial square-root.

6. A non-transitory computer-readable storage medium storing instructions of an electronic design automation (EDA) tool that, when executed by a computer, cause the computer to perform a method for proving equivalence between a first circuit design and a second circuit design, wherein the first circuit design includes a first square-root circuit and the second circuit design includes a second square-root circuit, the method comprising:

analyzing the first and second circuit designs to determine an input relationship between the square-root operand of the first square-root circuit and the square-root operand of the second square-root circuit, wherein the square-root operand of the first square-root circuit is not equal to the square-root operand of the second square-root circuit, and wherein the input relationship is of the form $c=a \cdot m^2$, where a is the square-root operand of the first square-root circuit, c is the square-root operand of the second square-root circuit, and m is an integer;

determining an output relationship between a set of outputs of the first square-root circuit and a set of outputs of the second square-root circuit based on the input relationship; and proving equivalence between the first and second circuit designs by using the input and output relationships, wherein using the input and output relationship to prove equivalence improves performance of the EDA tool in the computer.

7. The non-transitory computer-readable storage medium of claim 6, wherein prior to proving equivalence between the first and second circuit designs, the method comprises proving correctness of the first and second square-root circuits.

8. The non-transitory computer-readable storage medium of claim 7, wherein the first and second square-root circuits are bit-serial square-root circuits, and wherein proving correctness of a bit-serial square-root circuit includes:

creating a set of properties to prove correctness of the bit-serial square-root circuit, wherein the set of properties can be efficiently proven by using a bit-level solver, wherein the bit-serial square-root circuit receives a square-root operand as input, wherein the bit-serial square-root circuit outputs a w-bit square-root by performing an iterative computation, and wherein in each iteration of the iterative computation, the bit-serial square-root circuit determines v bits of the w-bit square-root, wherein v is less than w; and performing formal verification of the bit-serial square-root circuit by attempting to prove the set of properties using the bit-level solver.

9. The non-transitory computer-readable storage medium of claim 8, wherein the set of properties does not include any terms that compute a square of a w-bit partial square-root.

10. The non-transitory computer-readable storage medium of claim 8, wherein the set of properties includes terms that multiply v bits of a w-bit partial square-root that were determined in a given iteration with the w-bit partial square-root.

11. An apparatus, comprising:

a processor; and a non-transitory computer-readable storage medium storing instructions for formal equivalence checking that, when executed by the processor, cause the processor to perform a method for proving equivalence between a first circuit design and a second circuit design, wherein the first circuit design includes a first square-root circuit and the second circuit design includes a second square-root circuit, the method comprising:

proving correctness of the first and second square-root circuits;

analyzing the first and second circuit designs to determine an input relationship between the square-root operand of the first square-root circuit and the square-root operand of the second square-root circuit, wherein the input relationship is of the form $c=a \cdot m^2$, where a is the square-root operand of the first square-root circuit, c is the square-root operand of the second square-root circuit, and m is an integer;

determining an output relationship between a set of outputs of the first square-root circuit and a set of outputs of the second square-root circuit based on the input relationship; and proving equivalence between the first and second circuit designs by using the input and output relationships, wherein using the input and output relationship to prove equivalence improves performance of the EDA tool in the computer.

12. The apparatus of claim 11, wherein the first and second square-root circuits are bit-serial square-root circuits, and wherein proving correctness of a bit-serial square-root circuit includes:

creating a set of properties to prove correctness of the bit-serial square-root circuit, wherein the set of properties can be efficiently proven by using a bit-level solver, wherein the bit-serial square-root circuit receives a square-root operand as input, wherein the bit-serial square-root circuit outputs a w-bit square-root by performing an iterative computation, and wherein in each iteration of the iterative computation, the bit-serial square-root circuit determines v bits of the w-bit square-root, wherein v is less than w; and performing formal verification of the bit-serial square-root circuit by attempting to prove the set of properties using the bit-level solver.

13. The apparatus of claim 12, wherein the set of properties does not include any terms that compute a square of a w-bit partial square-root.

14. The apparatus of claim 12, wherein the set of properties includes terms that multiply v bits of a w-bit partial square-root that were determined in a given iteration with the w-bit partial square-root.

* * * * *